United States Patent
Isom et al.

(10) Patent No.: US 9,437,929 B2
(45) Date of Patent: Sep. 6, 2016

(54) DUAL POLARIZED ARRAY ANTENNA WITH MODULAR MULTI-BALUN BOARD AND ASSOCIATED METHODS

(71) Applicant: Raytheon Company, Waltham, MA (US)

(72) Inventors: Robert S. Isom, Allen, TX (US); Justin A. Kasemodel, McKinney, TX (US)

(73) Assignee: Raytheon Company, Waltham, MA (US)

(*) Notice: Subject to any disclaimer, the term of this patent is extended or adjusted under 35 U.S.C. 154(b) by 234 days.

(21) Appl. No.: 14/155,440

(22) Filed: Jan. 15, 2014

(65) Prior Publication Data

US 2015/0200460 A1 Jul. 16, 2015

(51) Int. Cl.
| | |
|---|---|
| *H01Q 21/00* | (2006.01) |
| *H01Q 25/00* | (2006.01) |
| *H01Q 9/04* | (2006.01) |
| *H01Q 1/50* | (2006.01) |
| *H03H 7/42* | (2006.01) |
| *H01Q 9/16* | (2006.01) |
| *H01Q 21/26* | (2006.01) |
| *H01P 5/10* | (2006.01) |

(52) U.S. Cl.
CPC .............. *H01Q 9/0407* (2013.01); *H01Q 1/50* (2013.01); *H01Q 9/16* (2013.01); *H01Q 21/0025* (2013.01); *H01Q 21/0087* (2013.01); *H01Q 21/26* (2013.01); *H03H 7/42* (2013.01); *H01P 5/10* (2013.01); *Y10T 29/49018* (2015.01)

(58) Field of Classification Search
CPC .... H01Q 21/0025; H01Q 1/50; H01Q 9/062; H01Q 9/285; H01Q 21/0006; H01Q 21/0087; H01Q 21/24; H01Q 21/26; H01Q 25/001; H01Q 21/245; H03H 7/42; H04B 7/0469; H04B 7/10; H01P 1/165; H01P 5/10
See application file for complete search history.

(56) References Cited

U.S. PATENT DOCUMENTS 3,846,721 A * 11/1974 Fritz ..................... H01P 5/10
                                                333/238
4,686,536 A    8/1987 Allcock
(Continued)

FOREIGN PATENT DOCUMENTS

JP    H07-106841    4/1995
WO    WO 2009/077791 A1    6/2009

OTHER PUBLICATIONS

Response dated Nov. 24, 2015 to Office Action dated Aug. 25, 2015; for U.S. Appl. No. 13/859,072; 12 pages.
(Continued)

*Primary Examiner* — Sue A Purvis
*Assistant Examiner* — Patrick Holecek
(74) *Attorney, Agent, or Firm* — Daly, Crowley, Mofford & Durkee, LLP

(57) ABSTRACT

An array antenna includes a modular, multi-layer, multi-balun board structure for use in feeding a dual polarization radiating element. In some embodiments, contacts on a multi-balun board structure may be directly conductively coupled to corresponding feed points of a dual polarization radiating element during antenna assembly. The multi-balun board structure may be inserted into an opening within an aperture board of an array antenna before the contacts are secured to the feed points. Dual balun board structures may be provided for some or all of the radiating elements on the aperture board.

19 Claims, 8 Drawing Sheets

(56) References Cited

U.S. PATENT DOCUMENTS

| | | | |
|---|---|---|---|
| 5,172,082 | A | 12/1992 | Livingston et al. |
| 5,453,751 | A | 9/1995 | Tsukamoto et al. |
| 5,880,694 | A | 3/1999 | Wang et al. |
| 6,147,648 | A | 11/2000 | Granholm et al. |
| 6,424,298 | B1 | 7/2002 | Nishikawa et al. |
| 6,459,415 | B1 | 10/2002 | Pachal et al. |
| 6,512,487 | B1 | 1/2003 | Taylor et al. |
| 6,856,297 | B1 | 2/2005 | Durham et al. |
| 6,867,742 | B1 | 3/2005 | Irion, II et al. |
| 6,876,336 | B2 | 4/2005 | Croswell et al. |
| 6,977,623 | B2 | 12/2005 | Durham et al. |
| 7,012,572 | B1 | 3/2006 | Schaffner et al. |
| 7,084,827 | B1 | 8/2006 | Strange et al. |
| 7,109,821 | B2 * | 9/2006 | Engargiola .............. H01P 5/10 333/26 |
| 7,113,142 | B2 | 9/2006 | McCarville et al. |
| 7,138,952 | B2 | 11/2006 | Mcgrath et al. |
| 7,221,322 | B1 | 5/2007 | Durham et al. |
| 7,315,288 | B2 | 1/2008 | Livingston et al. |
| 7,358,921 | B2 | 4/2008 | Snyder et al. |
| 7,414,590 | B2 | 8/2008 | Bij De Vaate et al. |
| 7,675,466 | B2 | 3/2010 | Gaucher et al. |
| 8,106,846 | B2 * | 1/2012 | Kikin .............. H01Q 7/00 343/797 |
| 8,154,466 | B2 * | 4/2012 | Lewis .............. H01Q 1/38 343/814 |
| 8,350,774 | B2 * | 1/2013 | Pickles .............. H01Q 9/16 343/795 |
| 8,952,752 | B1 | 2/2015 | Huettner |
| 2003/0112200 | A1 | 6/2003 | Marino |
| 2005/0156802 | A1 | 7/2005 | Livingston et al. |
| 2006/0097947 | A1 | 5/2006 | McCarville et al. |
| 2012/0146869 | A1 | 6/2012 | Holland et al. |
| 2013/0250536 | A1 * | 9/2013 | Satake .............. H03F 3/245 361/783 |
| 2015/0116174 | A1 * | 4/2015 | Yona .............. H01Q 1/38 343/797 |
| 2015/0123864 | A1 | 5/2015 | Boryssenko |

OTHER PUBLICATIONS

PCT International Preliminary Report of the ISA for Appl. No. PCT/US2014/012929 dated Oct. 22, 2105; 8 pages.

Kindt, et al., "Polarization Correction in Dual-Polarized Phased Arrays of Flared Notches;" Antennas and Propagation (APSURSI); IEEE International Symposium; Jul. 3-8, 2011; pp. 1961-1964.

Isom, et al., "Sysmmetric Baluns and Isolation Techniques;" U.S. Appl. No. 13/777,482, filed Feb. 26, 2013.

Kasemodel, et al.; "Broadband Planar Wide-Scan Array Employing Tightly Coupled Elements and Integrated Balun;" Phased Array Systems and Technology (ARRAY) 2010 IEEE International Symposium on; Oct. 12-15, 2010; pp. 467-472.

Lee et al., Array Antenna and Related Techniques; U.S. Appl. No. 13/859,072, filed Apr. 9, 2013.

Kasemodel, et al., "Broadband Array Antenna Enhancement with Spatially Engineered Dielectrics;" U.S. Appl. No. 13/590,769, filed Aug. 21, 2012.

Office Acton dated Aug. 25, 2015; for U.S. Appl. No. 19/359,072; 16 pages.

Cavallo, et al.; "Analysis of Common-Mode Resonances in Arrays of Connected Dipoles and Possible Solutions;" Radar Conference; IEEE; Sep. 30, 2009; pp. 441-444.

Hees, et al.; "Ultra Broadband Dual Polarized Dipole Array with Metallic Reflector," International Conference on Ultra Wideband; IEEE; Sep. 9-11, 2009; pp. 744-747.

PCT International Search Report of the ISA for PCT/US2014/012929 dated Apr. 29, 2014.

PCT Written Opinion of the ISA for PCT/US2014/012929 dated Apr. 29, 2014.

Lee, et al., "Array Antenna and Related Techniques;" U.S. Appl. No. 13/859,072, filed Apr. 9, 2013.

Nesic, et al.; "Wideband Printed Antenna with Circuiar Polarization;" Antennas and Propagation Society International Symposium; Jul. 13, 1997; pp. 1882-1885.

PCT Search Report of the ISA for PCT/US2015/011577 dated May 8, 2015.

Written Opinion of the ISA for PCT/US2016/011577 dated May 8, 2015.

Notice of Allowance dated Feb. 3, 2016; for U.S. Appl. No. 13/859,072; 10 pages.

Response dated May 23, 2016 to European Rule 161(1) and 162 EPC dated Nov. 20, 2015; for European Pat. App. No. 14705616.2; 32 pages.

* cited by examiner

DUAL POLARIZED ARRAY ANTENNA WITH MODULAR MULTI-BALUN BOARD AND ASSOCIATED METHODS

BACKGROUND

Many next generation communication systems will require antenna systems having dual polarized, coincident phase center radiating elements that can support dual linear and/or circular polarization operation. In many cases, these systems may also require antenna systems having a low profile. Some of these systems may further require that antenna systems be capable of both high bandwidth and/or high scan volume operation. Techniques, circuits, and systems are needed for use in providing antenna systems having one or more of the above-described qualities.

SUMMARY

An array antenna that uses dual polarized radiating elements includes one or more modular, multi-layer, dual-balun board structures to feed corresponding radiating elements. Each dual-balun board structure may be coupled directly to operative points on a corresponding dual polarized radiating element, the board being in an approximately perpendicular orientation with respect to the element. This permits the balun structures to be very close to the corresponding radiating element, thus allowing low profile antennas to be achieved. The dual-balun board structure can be formed so that it fits within an area defined by a unit cell of the array antenna. Because the dual-balun board structure is modular, installation can be quick and relatively simple. In addition, in many implementations, dual-balun board structures permit easy replacement of inoperative balun boards after antenna fabrication is complete. Furthermore, the dual balun board structures may be fabricated in a relatively low cost manner using well known printed circuit board (PCB) techniques. As such, the dual baton board approach can reduce the antenna fabrication time and overall cost of dual polarized array antenna systems.

In accordance with one aspect of the concepts, systems, circuits, and techniques described herein, an array antenna comprises a plurality of dual polarized radiating elements disposed on a first dielectric layer and a modular, multi-layer, dual-balun hoard structure coupled to a first of the dual polarized radiating elements. The modular, multi-layer, dual-balun board structure includes a first balun to feed a first polarization orientation of the first dual polarized radiating element and a second balun to feed a second, orthogonal polarization orientation of the first dual polarized radiating element. The dual-balun board structure is held in a substantially perpendicular orientation with respect to the first dielectric layer and extends at least partially through an opening in the first dielectric layer.

In one embodiment, a modular, multi-layer, dual balun board structure is provided for each of (or a subset of) the radiating elements in the array.

In one embodiment, the plurality of dual polarized radiating elements define a plurality of unit cells on the first dielectric layer, wherein the modular, multi-layer, dual-balun board structure fits within a projection of a unit cell associated with the first dual polarized radiating element.

In one embodiment, the modular, multi-layer, dual-balun, board structure includes first and second external contacts to carry a balanced signal associated with the first polarization orientation of the first dual polarized radiating element and third and fourth external contacts to carry a balanced signal associated with the second polarization orientation of the first dual polarized radiating element, wherein the first and third external contacts are located on a first surface of the modular, multi-layer, dual-balun board structure and the second and fourth external contacts are located on a second surface of the modular, multi-layer, dual-balun board structure that is opposite the first surface.

In one embodiment, the first dual polarized radiating element has first and second conductive members associated with the first polarization orientation and third and fourth conductive members associated with the second polarization orientation, wherein the first, second, third, and fourth external contacts of the modular, multi-layer, dual-balun board structure are directly conductively coupled to the first, second, third, and fourth conductive members of the first dual polarized radiating element, respectively.

In one embodiment, the modular, multi-layer, dual-balun board structure includes a crossover network coupled between the first, second, third, and fourth external contacts and the balanced ports of the first and second baluns.

In one embodiment, the opening in the first dielectric layer through which the dual-balun board structure passes cuts through a central portion of the first dual polarized radiating element.

In one embodiment, the opening in the first dielectric layer through which the dual balun board structure passes is diagonally oriented with respect to the first dual polarized radiating element.

In one embodiment, the first dual polarized radiating element is a dual polarized dipole element.

In one embodiment, the dual-balun board structure includes a ground plane separating the first balun and the second balun.

In one embodiment, the dual-balun board structure includes a first coaxial connector coupled to a single-ended input port of the first balun and a second coaxial connector coupled to a single-ended input port of the second balun.

In one embodiment, the plurality of dual polarized radiating elements includes a plurality of coincident-phase center, dual polarized radiating elements.

In accordance with another aspect of the concepts, systems, circuits, and techniques described herein, a method for use in fabricating an array antenna includes providing an aperture board having a plurality of dual polarized radiating elements disposed thereon, the aperture board having openings through central regions of at least some of the dual polarized radiating elements and providing a modular, multi-layer, dual-balun board having a first balun to feed a first polarization orientation of a dual polarized radiating element and a second balun to feed a second, orthogonal polarization orientation of the dual polarized radiating element. The modular, multi-layer, dual-balun board is inserted through an opening in the aperture board associated with the first dual polarized radiating element and contacts on the modular, multi-layer, dual-balun board are then secured directly to corresponding conductive portions of the first dual polarized radiating element using a conductive coupling agent.

In one embodiment, the conductive coupling agent includes at least one of solder and conductive epoxy.

In one embodiment, the first dual polarized radiating element includes first and second conductive members associated with the first polarization orientation and third and fourth conductive members associated with the second polarization orientation, the first and third conductive members being on one side of the opening associated with the first dual polarized radiating element and the second and fourth conductive members being on an opposite side of the opening.

In one embodiment, the contacts on the modular, multi-layer, dual-balun board structure include first and second contacts conductively coupled to the balanced port of the first balun and third and fourth contacts coupled to the balanced port of the second balun, the first and third contacts being located on a first surface of the dual-balun board structure and the second and fourth contacts being on a second surface of the dual-balun board structure, wherein securing contacts includes securing the first and third contacts to the first and third conductive members, respectively and securing the second and fourth contacts to the second and fourth conductive members, respectively.

In one embodiment, other modular, multi-layer, dual-balun boards having the same characteristics as the first board are also inserted through openings in the aperture board associated with other dual polarized radiating elements and the corresponding contacts are secured in a similar fashion.

In accordance with a further aspect of the concepts, systems, circuits, and techniques described herein, a multi-layer printed circuit board (PCB) comprises: a first balun having a single ended port and a balanced port, the first balun being implemented on one or more first layers of the PCB; a second bales having a single ended port and a balanced port, the second balun being implemented on one or more second layers of the PCB. The PCB also includes first, second, third, and fourth external contacts, the first and third contacts located on a first exterior surface of the PCB and the second and fourth contacts located on a second exterior surface of the PCB opposite the first surface. The PCB further includes a crossover network to conductively couple the first and second exterior contacts to the balanced port of the first balun in a phase matched manner and to conductively couple the third and fourth exterior contacts to the balanced port of the second balun in a phase matched manner.

In one embodiment, the multi-layer PCB farther comprises a ground plane on an intermediate layer of the PCB, the ground plane separating the first balun from the second balun.

In one embodiment, the ground plane forms a part of microstrip or stripline elements of both the first balun and the second balun.

BRIEF DESCRIPTION OF THE DRAWINGS

The foregoing features may be more understood from the following description of the drawings in which.

DETAILED DESCRIPTION

An array antenna that uses dual polarized radiating elements includes one or more modular, multi-layer, dual-balun board structures to feed corresponding radiating elements. Each dual-balun board structure may be coupled directly to operative points on a corresponding dual polarized radiating element with the board being in an approximately perpendicular orientation with respect to the element. This permits the balun structures to be close to the corresponding radiating elements, thus allowing low profile antennas to be achieved. The dual-balun board structures can be formed so that they fit within an area defined by a unit cell of the array antenna. Because the dual-balun board structures are modular, installation can be quick and relatively simple. In addition, in many implementations, dual-balun board structures permit easy replacement of inoperative balun boards after antenna fabrication is complete. Furthermore, the dual balun board structures may be formed in a relatively low cost manner using well known printed circuit board (PCB) techniques. As such, the dual balun board approach can reduce the antenna fabrication time and overall cost of dual polarized array antenna systems.

Figure 1:
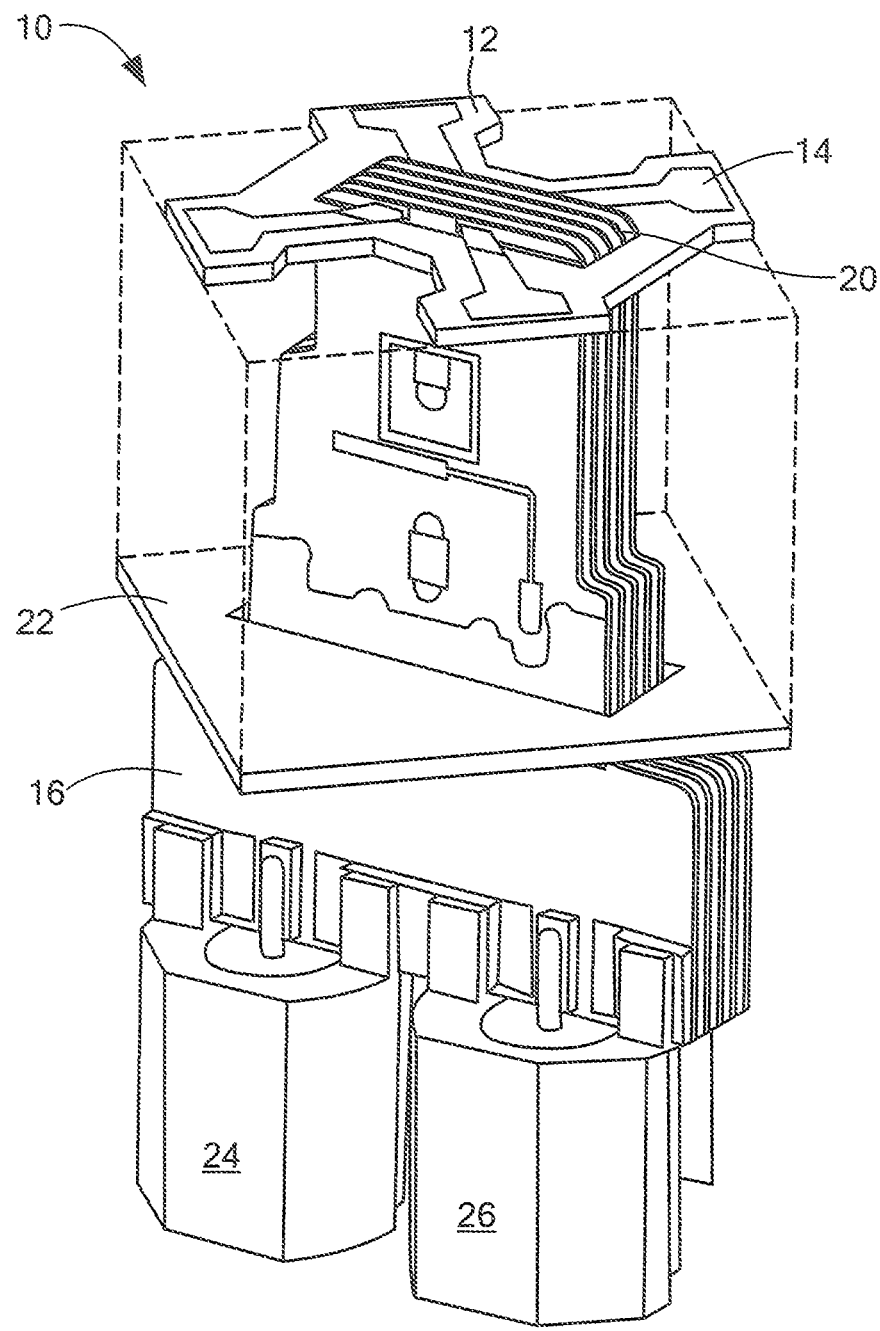
FIG. 1 is a diagram illustrating an exemplary antenna assembly that may be part of an array antenna in accordance with an embodiment.

FIG. 1 is a diagram illustrating an exemplary antenna assembly 10 that may be part of an array antenna system in accordance with an embodiment. As shown, the assembly 10 includes an aperture board 12 having a dual polarized dipole radiating element 14 disposed thereon. For ease of illustration, only a single radiating element 14 is shown in FIG. 1. It should be appreciated, however, that the aperture board 12 may include a number of radiating elements 14 arranged in a desired array pattern. The radiating elements 14 may be coincident phase center dual polarized elements in some implementations. Although illustrated in FIG. 1 with a dual polarized dipole radiating element 14, it should be appreciated that other types of dual polarized radiating elements may be used in other embodiments such as, for example, dual polarized patch elements, loop elements, spirals, slot antennas, and others.

The antenna assembly 10 of FIG. 1 also includes a multiple layer, dual balun printed wiring board (PWB) 16 to serve as a feed for the dual polarized radiating element 14. The dual balun PWB 16 includes a first balun for use in supporting a first polarization orientation (e.g., vertical polarization, etc.) of the dual polarized radiating element 14 and a second balun for use in supporting a second, orthogonal polarization orientation (e.g., horizontal polarization, etc.) of the dual polarized radiating element 14. In the illustrated embodiment, the dual balun PWB 16 is inserted through an opening 20 in the aperture board 12. Exterior contacts on the dual balun PWB 16 may then be secured to corresponding conductive elements of the dual polarized radiating element 14 using a conductive coupling agent such as, for example, solder, spring finger or pin, or conductive epoxy. Because of this direct connection between the contacts on the dual balun board and the radiating element, the overall thickness of the array antenna can be reduced considerably compared to prior dual polarized array designs. The direct connection is made possible, at least in part, because both baluns are implemented on a common board structure.

As shown, the dual balun PWB 16 can be made small enough to fit within a unit cell of the antenna array. Thus, in some embodiments, dual balun boards may be provided for each of the dual polarized elements in the array (or a subset of the elements) without having to be concerned with whether the boards will fit within the array. In dual polarized array antennas of the past, the (separate) batons are typically implemented behind the antenna backplane, thus resulting in relatively thick antennas. Significantly, the dual balun PWB approach described herein can enable the batons of the antenna system to reside between the radiating elements 14 and the associated backplane (or ground plane) 22 of the antenna. This can result in a much thinner (lower profile) antenna overall.

As shown in FIG. 1, in some embodiments, the dual balun PWB 16 will be substantially perpendicular to the aperture board 12 when secured in place (although other orientations are also possible). The dual balun PWB 16 may also be staked to the backplane 22 to hold the PWB 16 in this position and to provide further structural integrity to the antenna. A conductive coupling agent such as solder or conductive epoxy may be used to secure ground pads on the PWB 16 to the backplane 22. In some embodiments, the backplane 22 may extend across the entire array as a single conductive sheet, although the Sheet may be perforated in some implementations.

In some embodiments, one or more connectors 24, 26 may be coupled to the dual balun PWB 16 to support connection of the antenna to other circuitry (e.g., beamformer circuitry, radio frequency (RF) transmit and/or receiver circuitry, etc.). In the illustrated embodiment, coaxial connectors are provided, but other types of connectors may alternatively be used. Each connector 24, 26 may be coupled to a single-ended port of a corresponding balun. Thus, the first connector 24 may be coupled to the first balun in support of first polarization orientation of the antenna and the second connector 26 may be coupled to the second balun in support of the second polarization orientation of the antenna. In some embodiments, no connectors are provided. In these embodiments, electrical contacts on the PWB 16 or some other structures may be used to support connection to other circuitry.

In at least one embodiment, the first and second bah ms of the dual balun PWB 16 are implemented on different layers of the PWB 16. Thus, the first balun may be implemented on one or more first metal layers and the second bakers may be implemented on one or more second metal layers that are different from the first layers, in a back to back configuration. The PWB 16 may include a ground plane on an intermediate metal layer in some implementations that separates the first balun from the second balun. In some embodiments, microstrip technology is used to implement the baluns. In a microstrip implementation, the microstrip lines of both baluns may use the same intermediate ground plane (from different sides thereof) or a separate ground plane may be provided for each balun. In some other embodiments, stripline technology is used to implement the baluns. In a stripline implementation, ground planes are provided on either side of the balun circuitry for each balun. Baluns using other transmission line technologies may alternatively be used (e.g., coplanar waveguide, etc.).

The dual balun PWB 16 may use any type of baluns that are capable of implementation on multi-layer printed wiring boards for operation within a desired frequency range. In some embodiments, for example, Marchand baluns are used in dual balun PWB 16 to provide a relatively wide operational bandwidth. In at least one embodiment, the dual balun PWB 16 uses the Marchand-type balun structures described in co-pending U.S. patent application Ser. No. 13/777,482, filed Feb. 26, 2013, which is co-owned with the present application and is hereby incorporated by reference herein in its entirety. In some embodiments, balms are used that the microstrip versions of the stripline baluns described in U.S. patent application Ser. No. 13/777,482. Other types of baluns can alternatively be used (e.g., double Y baluns, etc.).

Figure 2:
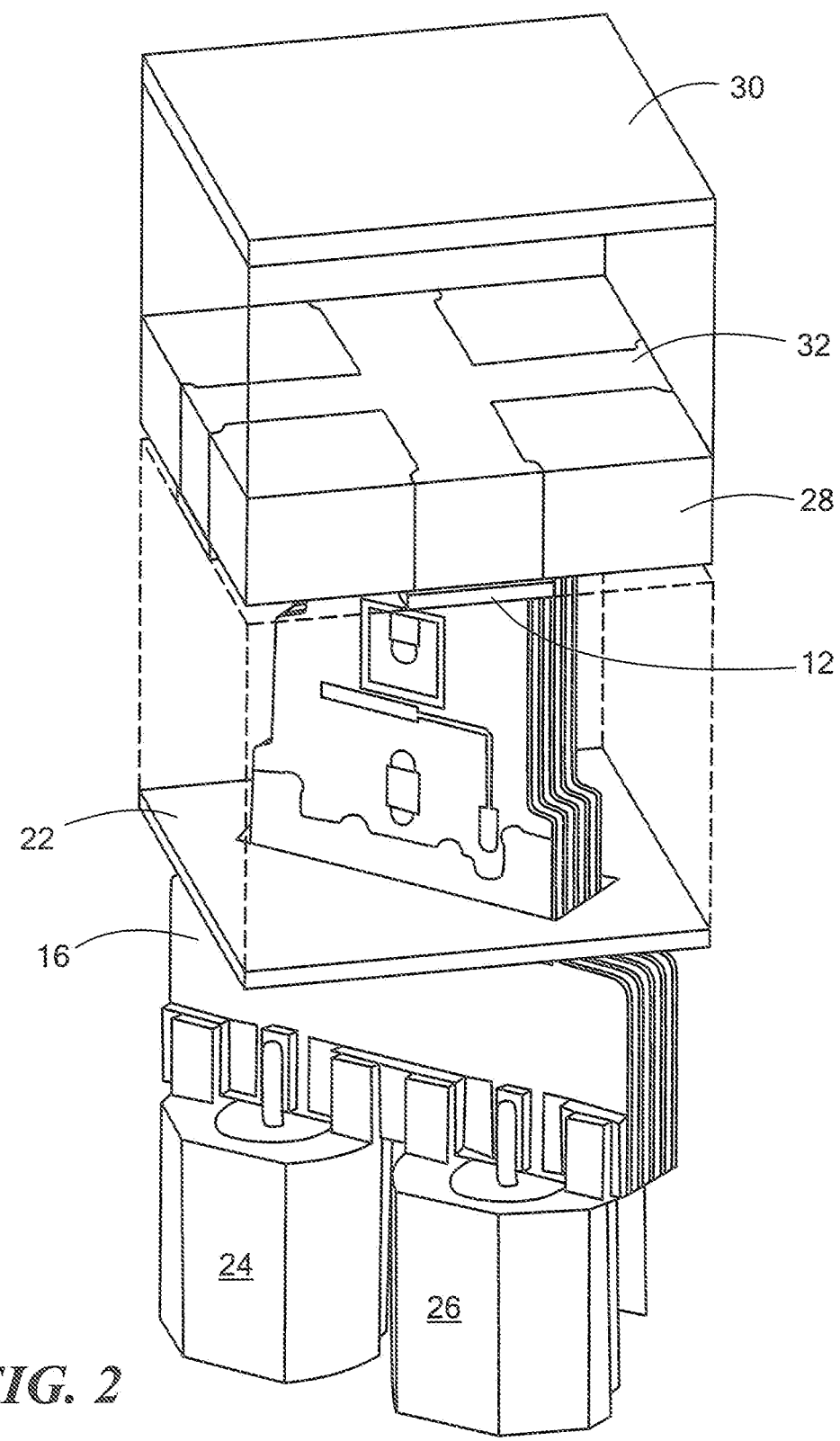
FIG. 2 is a diagram illustrating the exemplary antenna assembly of FIG. 1 with a multi-layer Wide Angle Impedance Matching (WAIM) structure disposed thereover as a radome in accordance with an embodiment.

In some embodiments, a radome may be disposed over the antenna assembly 10 of FIG. 1 after the multi-balun PWB 16 has been secured to the aperture board 12. FIG. 2 is a diagram illustrating such an arrangement. As shown in FIG. 2, in one approach, a multi-layer Wide Angle Impedance Matching (WAIM) structure 28, 30 may be used as a radome to improve the antenna's ability to scan over wide angles. The WAIM 28, 30 may extend across the entire face of the array. The WAIM that is used may include a conventional WAIM or a meta-material WAIM. In at least one embodiment, a lower layer 28 of the WAIM may have multiple different dielectric sections. For example, the WAIM may include a section 32 of a higher dielectric constant material that roughly follows the shape of the underlying radiating element 14 with the remainder comprising a lower dielectric constant filler material (e.g., foam, etc.). An upper layer 30 of the WAIM may include a continuous layer of dielectric material. Other radome arrangements may alternatively be used in other embodiments.

Figure 3:
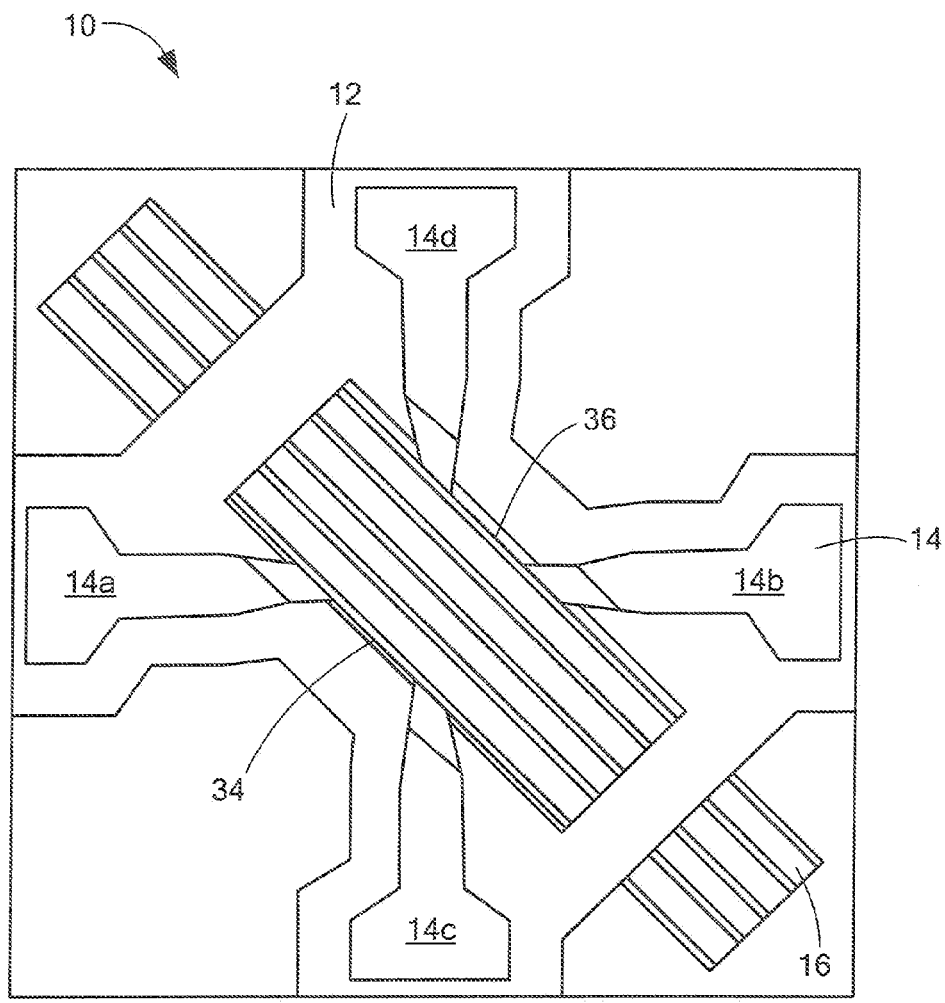
FIG. 3 is a top view of the exemplary antenna assembly of FIG. 1 showing the dual balun PWB secured within an opening in the aperture board in accordance with an embodiment.

FIG. 3 is a top view of the antenna assembly 10 of FIG. 1 showing the dual balun PWB 16 inserted within the opening 20 of the aperture board 12. In the illustrated embodiment, the opening 20 is a substantially rectangular slot that is diagonally oriented with respect to the dual polarized dipole radiating element 14. Other shapes may be used in other embodiments (e.g., square, etc.). As shown in FIG. 3, the radiating element 14 includes first and second conductive members 14a, 14b associated with horizontal polarization and third and fourth conductive members 14c, 14d associated with vertical polarization. The opening 20 of the aperture board 12 is centrally located with respect to the radiating element 14 with first and third conductive members 14a, 14c on one side and the second and fourth conductive members 14b, 14d on an opposite side. During an assembly process, after the dual balun PWB 16 is inserted into the opening 20, conductive contacts on the dual balun PWB 16 are conductively coupled and secured to the first, second, third, and fourth conductive members 14a, 14b, 14c, 14d, respectively. This may be performed, for example, using a conductive coupling agent such as solder or conductive epoxy.

As shown in FIG. 3, contacts on a first surface 34 of the dual balun PWB 16 are coupled to the first and third conductive members 14a, 14c of the radiating element 14 and contacts on a second, opposite surface 36 of the dual balun PWB 16 are coupled to the second and fourth conductive members 14b, 14d of the radiating element 14. Thus, each surface 34, 36 of the dual balun PWB 16 includes one antenna contact associated with horizontal polarization and one antenna contact associated with vertical polarization. In at least one embodiment, to achieve this contact configuration on the dual balun PWB 16, a crossover network is provided within the PWB 16.

Figure 4:
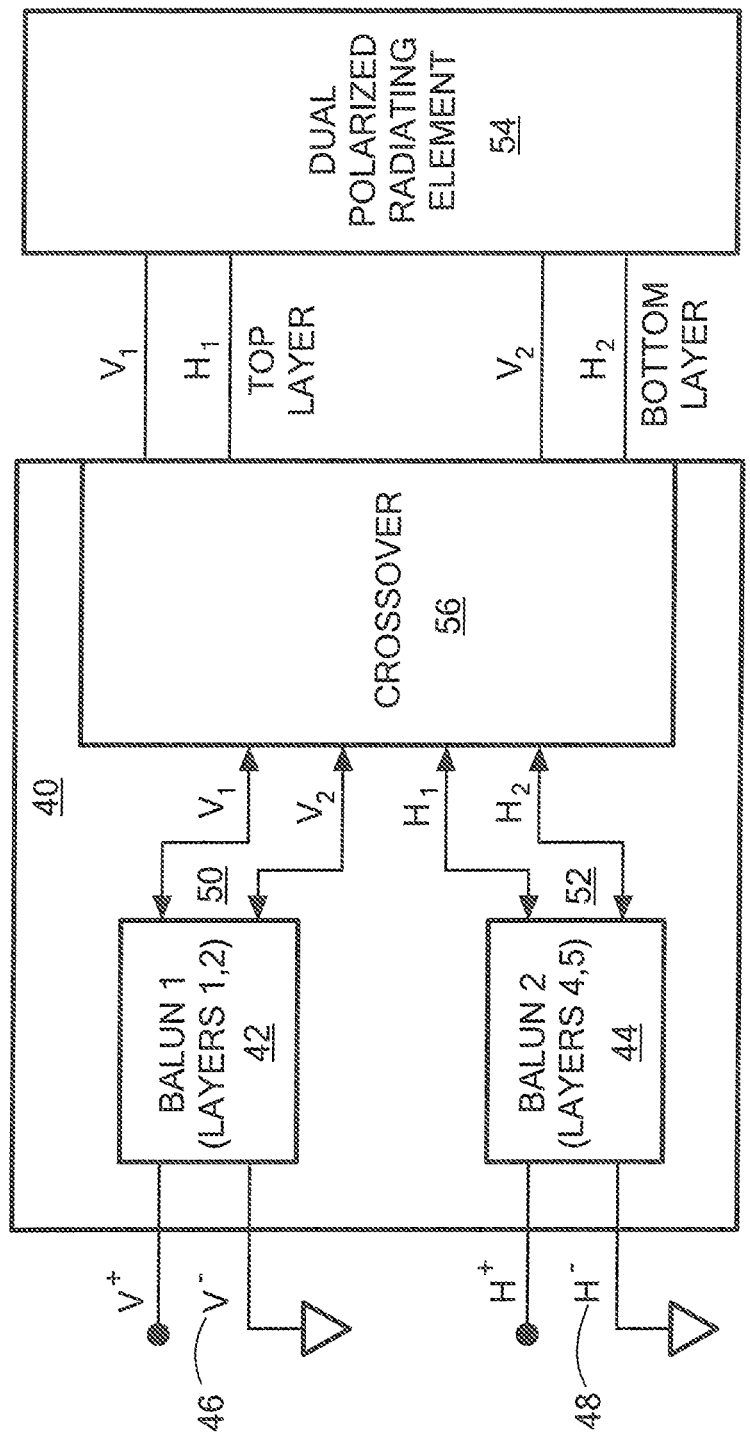
FIG. 4 is a block diagram illustrating an exemplary circuit configuration associated with a dual balun PWB in accordance with an embodiment.

FIG. 4 is a block diagram illustrating an exemplary circuit configuration within a dual balun PWB 40 of an array antenna in accordance with an embodiment. As shown, the dual balun. PWB 40 includes first and second baluns 42, 44. The first balun 42 may be implemented, for example, on first and second metal layers of the dual balun PWB 40 and the second balun 44 may be implemented on fourth and MI layers thereof in an embodiment. Although not shown, a ground plane (or multiple ground planes) may be provided on an intermediate metal layer (or layers) between the first and second baluns 42, 44 (e.g., a third metal layer). In some embodiments, the ground plane may form a part of both of the baluns. It should be appreciated that different balun designs may require a different number of metal layers to implement and, therefore, the total number of Layers associated with each balun (and within the dual balun PWB 40 as a whole) may vary from implementation to implementation. In some embodiments, the two baluns may have one or more metal layers in common. In other embodiments, the two balms may be implemented on two different sets of metal layers with no shared layers.

As illustrated in FIG. 4, each of the baluns 42, 44 may include a corresponding single-ended port 46, 48 for use in coupling the dual balun PWB 40 to other circuitry (e.g., a beamformer, etc.). Each balun 42, 44 may also include a balanced port 50, 52 that is coupled to corresponding portions of the associated dual polarized radiating element 54. As shown, the balanced port 50 of the first balun 42 may be associated with vertical polarization and the balanced port 52 of the second balun 44 may be associated with horizontal polarization. The conductors forming the balanced ports 50, 52 of each balun 42, 44 will often be on the same metal layer or adjacent metal layers of the PWB 40. However, as discussed previously, the exterior electrical contacts of the PWB 40, at least in some embodiments, needs one horizontal polarization contact and one vertical polarization contact on each of two opposing surfaces thereof. A crossover network 56 may be provided within the dual balun PWB 40 to achieve this electrical contact arrangement. The crossover network 56 may use via connections and/or other inter-layer conductive connections, as well as one or more conductive traces on the metal layers of the PWB, to achieve the desired contacts. The crossover network 56 also provides phase matched paths between the inputs and the outputs thereof. Thus, in some embodiments, a top layer of the dual balun PWB 40 may have a first vertical polarization balanced conductor ($V_1$) contact and a first horizontal polarization balanced conductor ($H_1$) contact. Likewise, a bottom layer of the dual balun PWB 40 may have a second vertical polarization balanced conductor ($V_2$) contact and a second horizontal polarization balanced conductor ($H_2$) contact.

Figure 5:
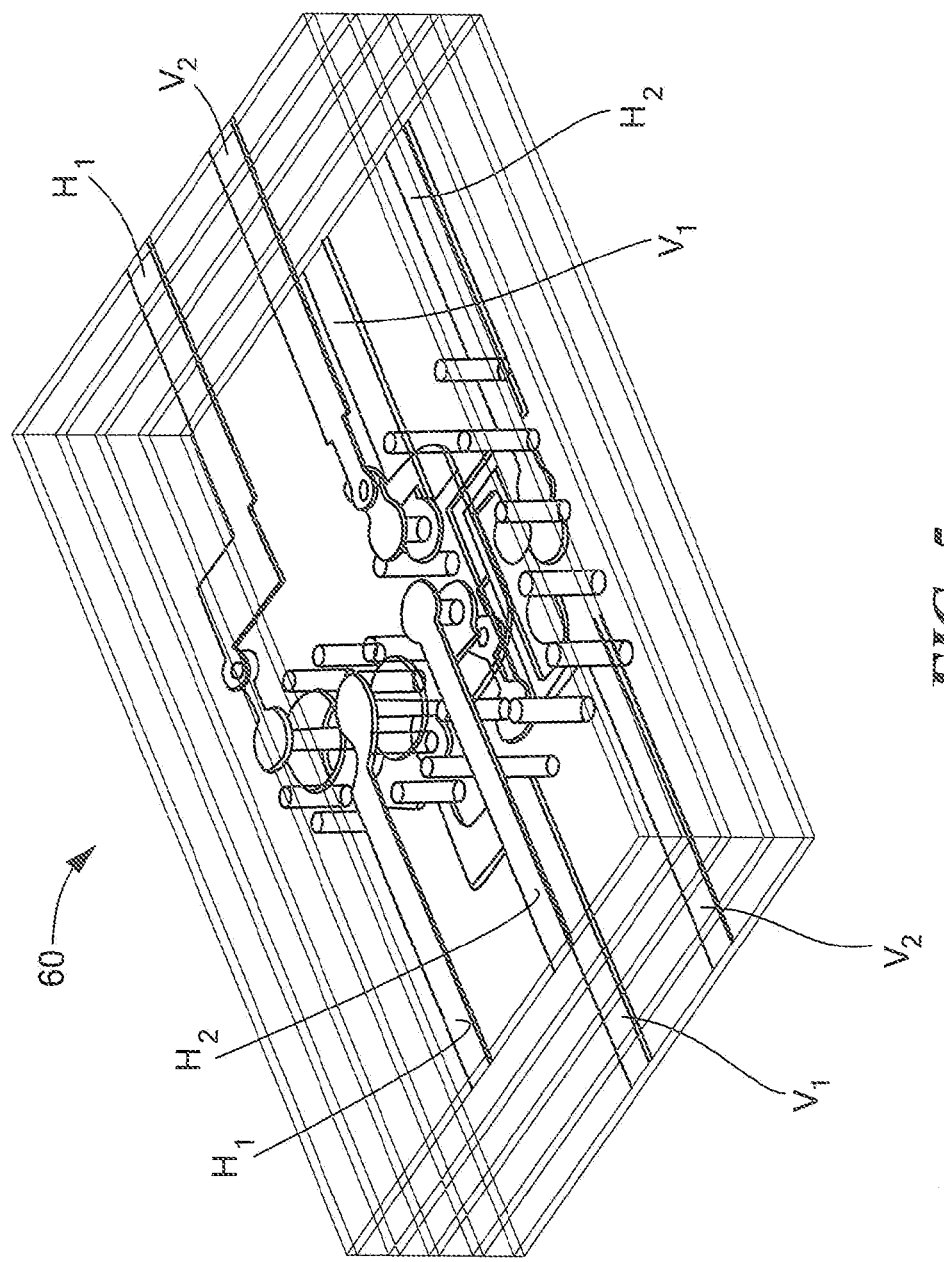
FIG. 5 is a diagram illustrating an exemplary crossover network that may be used within a multi-layer, dual balun PWB in accordance with a embodiment.

FIG. 5 is a diagram illustrating an exemplary crossover network 60 that may be used within a multi-layer, dual balun PWB in accordance with a embodiment. As shown, on a balun end, the crossover network 60 includes two vertical balanced terminals (V1, V2) on a first metal layer and two horizontal balanced terminals (H1, H2) on a second, different layer. In contrast, on an antenna end, the crossover network 60 includes one vertical balanced terminal (V1) and one horizontal balanced terminal (H2) on one layer and another vertical balanced terminal (V2) and another horizontal balanced terminal (H1) on another layer. As shown, via connections and transmission line segments are used to achieve this arrangement.

Figure 6:
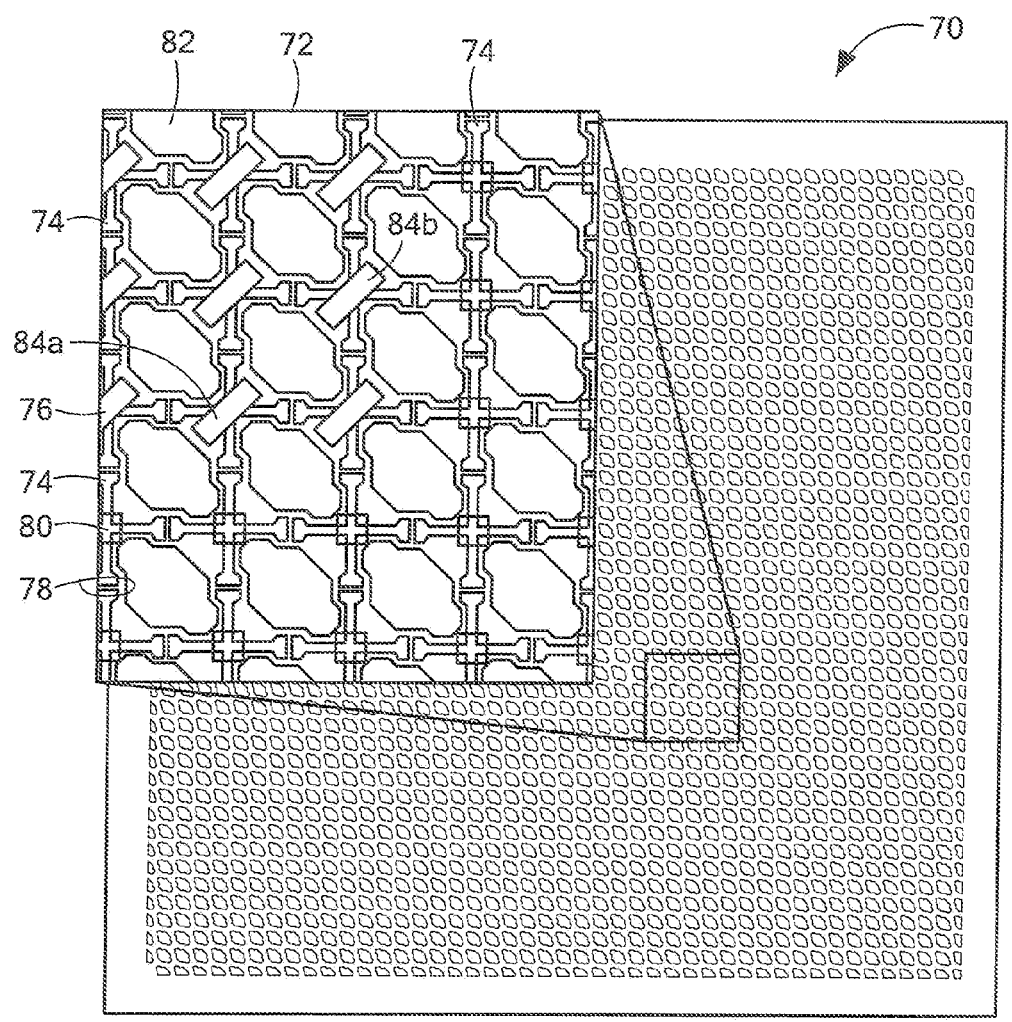
FIG. 6 is a diagram illustrating an exemplary aperture board that may be used in a dual polarized array antenna system in accordance with an embodiment.

FIG. 6 is a diagram illustrating an exemplary aperture board 70 that may be used in a dual polarized array antenna system in accordance with an embodiment. An expanded view 72 of the aperture board 70 is shown to display detail of the board 70. As illustrated, the aperture board 70 includes a large number of dual polarized dipole radiating elements 74 arranged in a grid pattern on an upper surface thereof. In the illustrated embodiment, the radiating elements 74 are arranged as a tightly coupled array having capacitive coupling (e.g., parasitic capacitance 78) between adjacent elements of the array. Such an array arrangement may be used to simulate the theoretical "current sheet" type antenna. It should be appreciated, however, that various features described in the present disclosure may also be used in other types of array antennas, including arrays where the radiating elements are not as tightly coupled.

As shown in FIG. 6, some of the radiating elements 74 on aperture board 70 have a diagonal opening 76 extending through the board 70 in a central location with respect to the element 74. As described previously, these openings 76 are used to mount the dual balun boards to the antenna. Although shown as rectangular in the illustrated arrangement, it should be appreciated that other shapes may alternatively be used (including embodiments that use multiple openings to mount a single dual balun board). As described previously, the openings allow the dual balun hoard to be directly conductively coupled to operative conductive portions of the corresponding radiating elements in a manner that supports a very compact, low profile antes a design. Some of the elements 74 shown in FIG. 6 do not have an opening 76 in a central portion thereof. These elements 74 will not include a dual balun board. Instead, these radiating elements may be terminated at a central location thereof (e.g., termination 80). These types of terminated elements may be used around a periphery of a test antenna to make the antenna look electrically larger to increase testing accuracy. Such elements may be removed in a finished antenna design. As shown in FIG. 6, the aperture board 70 may also include larger openings 82 extending through the board in regions between the various elements 74. This technique may be used in some embodiments to, for example, replace the board material with air dielectric to reduce dielectric loss and antenna weight.

Figure 7:
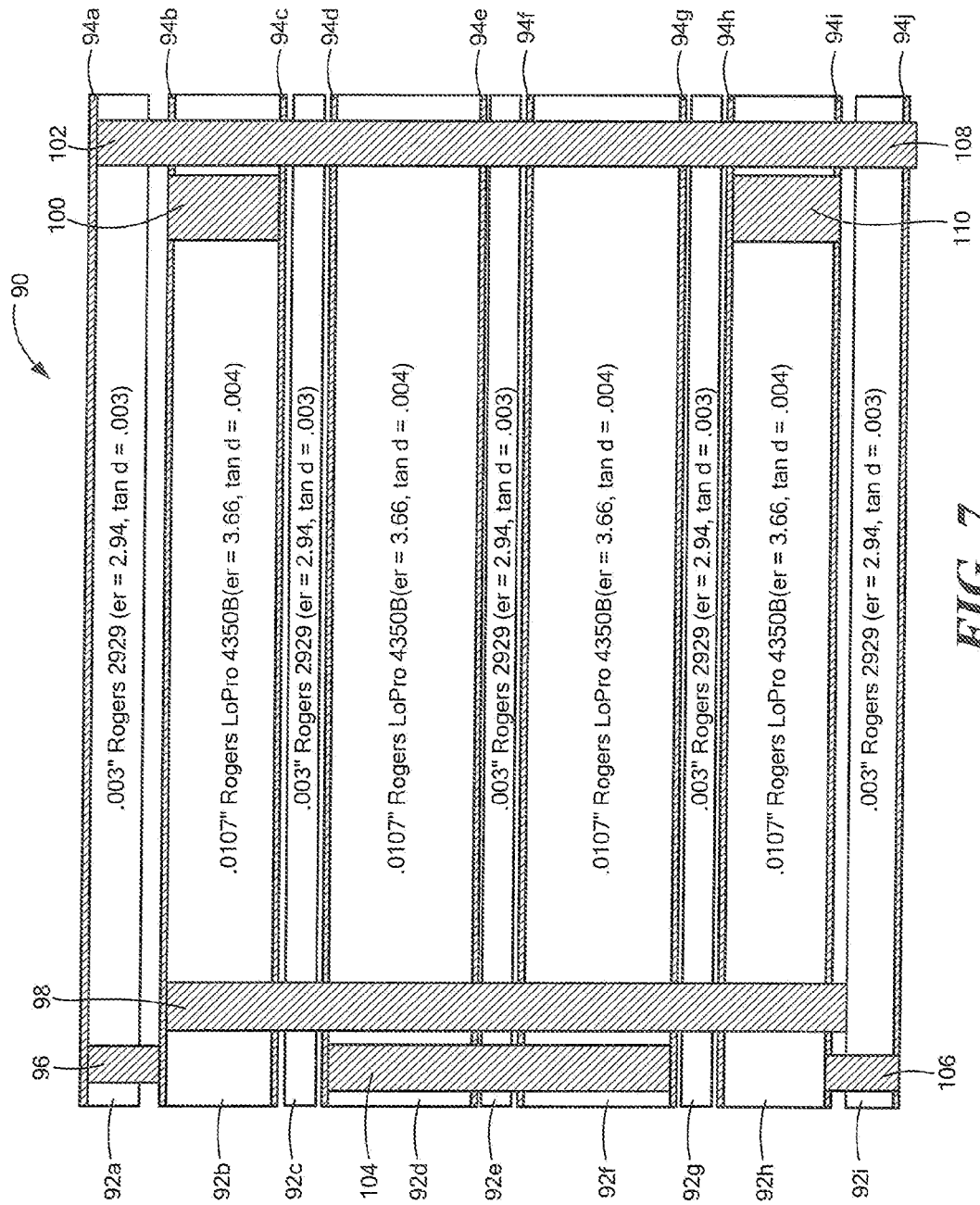
FIG. 7 is a sectional side view of a portion of a dual balun board that includes a crossover network in accordance with an embodiment.

FIG. 7 is a sectional side view of a portion of a dual balun board 90 that includes a crossover network in accordance with an embodiment. As shown, the dual bale board includes nine dielectric layers 92*a*-92*i* and ten metal layers 94*a*-94*j*. Various via connections 96, 98, 100, 102, 104, 106, 108, 110 are used to provide conductive coupled between structures on the metal layers 94*a*-94*j*. In the illustrated embodiment, the dielectric layers 92*a*-92*i* alternate between thinner and thicker board materials from the top to the bottom of the multi-layer board. This arrangement may be used to, for example, maintain proper transmission line impedances. As shown, the thicker board material may be formed from a 0.0107 inch thick Rogers LoPro 4350B material and the thinner board material may be formed from a 0.003 inch thick Rogers 2929 prepreg material in the illustrated embodiment in an embodiment. The design of FIG. 7 uses mostly drilled vias, although one or more laser vias e.g., vias 96, 106 in FIG. 7) may be used to reduce the number of embedded resistor layers (TICER™ or OhmegaPly® resistive material on copper foils). It should be appreciated that the multi-board arrangement shown in FIG. 7 depicts one design that may be used in accordance with an exemplary embodiment. Other structures may alternatively be used including structures with different numbers of layers, structures with different layer thicknesses and dielectric materials, and layers with different types of interlayer coupling.

Figure 8:
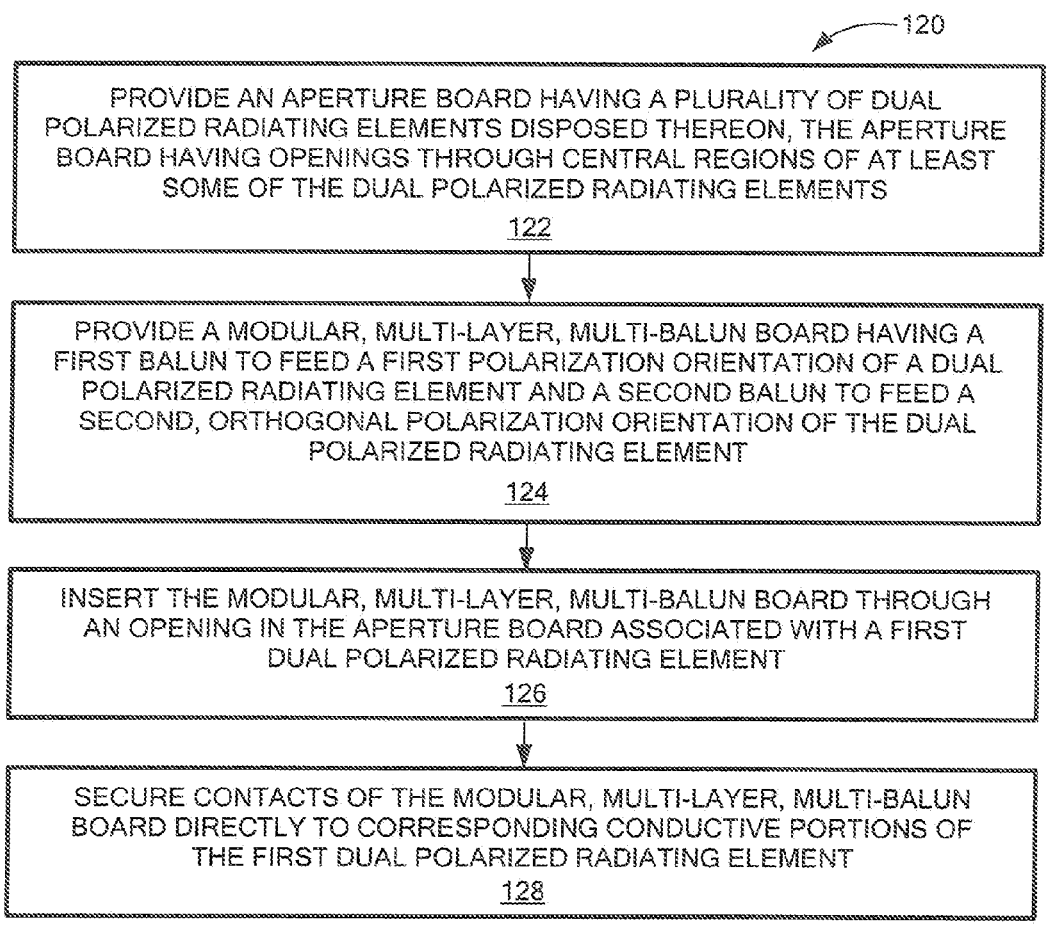
FIG. 8 is a flowchart illustrating a method for use in fabricating an array antenna in accordance with an embodiment.

FIG. 8 is a flowchart illustrating a method 120 for use in fabricating an array antenna in accordance with an embodiment. First, an aperture board is provided that includes a plurality of dual polarized radiating elements on a surface thereof (block 122). The aperture board also includes a umber of openings through central regions of at least some of the dual polarized radiating elements. A modular, multi-layer board assembly is also provided (block 124). The multi-layer, multi-balun board assembly includes a first balun to feed a first polarization orientation of a dual polarized radiating element and a second balun to feed a second polarization orientation of the dual polarized radiating element. In some embodiments, the first balun and the second balun may be implemented on different layers of the board assembly. In at least one implementation, a ground plane may be used on a central layer of the board assembly to separate the first and second baluns.

The multi-balun board assembly may next be inserted into an opening in the aperture board associated with a first dual polarized radiating element (block 126). Contacts on the multi-balun board assembly may then be secured to corresponding conductive feed points of the first dual polarized radiating element (block 128). In some embodiments, the contacts may be secured using a conductive coupling agent such as, for example, solder, conductive epoxy, or a conductive adhesive. The multi-balun board assembly may be held in a substantially perpendicular orientation with respect to the aperture board after it has been secured. As described previously, in some embodiments, the board may also be staked to an underlying back plane to add further stability. In at least one embodiment, the multi-balun hoard assembly will have a size that fits within a projection of the unit cell associated with a corresponding radiating element.

In some embodiments, techniques and features described herein may be used to provide low profile, wideband, coincident phase center arrays that are operative over wide frequency bandwidth and large scan volume. In one exemplary embodiment, for example, dual balun boards are used that include microstrip car stripline Marchand baluns to feed a plurality of tightly coupled, dual polarized, coincident phase center dipole elements to achieve an antenna that is operative over a frequency range of 3-18 GHZ. A metamaterial WAIM is used as a radome in this embodiment to improve wide angle scanning in the antenna. The array is capable of low cross polarization for improved performance over the scan volume. The array is also relatively easy to calibrate when integrated into a system architecture. The exemplary antenna design incorporates common mode isolation to help prevent dropouts in performance due to the propagation of surface waves at large scan angles.

In the various embodiments described above, dual balun hoard structures are described that may be used to feed dual polarized radiating elements in an array antenna. Each dual balun board can be coupled to a single corresponding antenna element during antenna fabrication, in some embodiments, however, a greater number of baluns may be implemented on a board structure for use in feeding multiple dual polarized elements. For example, referring to FIG. 3, in an alternative embodiment, the dual balun PWB 16 may be replaced with a board having four balms. This board could then span across two different radiating elements in the array. Referring now to FIG. 6, for example, a four balun board structure could be inserted into openings 84a and 84b in an embodiment to provide a feed for both of the radiating elements. This approach could also be extended to additional radiating elements. In this manner, antenna part count, assembly time, and fabrication cost may be further reduced.

As is well known, modern manufacturing processes rarely produce perfect structural features. For example, a rectangular structure is rarely, if ever, perfectly rectangular and a planar surface is rarely, if ever, perfectly planar. That is, there is typically a normal range of variation in a structural feature that is associated with an underlying fabrication process. As used herein, the word "substantially" is intended to have its ordinary and customary meaning to denote approximation. Thus, when used to modify a specific structural feature or parameter, the term "substantially" means an approximation of the feature or parameter that will encompass a normal range of variation. In other words, the term "substantially" is being used as a descriptive term to avoid a strict numerical boundary for the corresponding feature or parameter.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. An array antenna comprising:
   a plurality of dual polarized radiating elements on a first dielectric layer, the plurality of dual polarized radiating elements having a first dual polarized radiating element; and
   a modular, multi-layer, dual-balun board structure coupled directly to the first dual polarized radiating element, the modular, multi-layer, dual-balun board structure having a first balun to feed a first polarization orientation of the first dual polarized radiating element and a second balun to feed a second, orthogonal polarization orientation of the first dual polarized radiating element, the dual-balun board structure being held substantially perpendicular to the first dielectric layer and extending at least partially through an opening in the first dielectric layer; and
   the first dual polarized radiating element has first and second conductive members associated with the first polarization orientation and third and fourth conductive members associated with the second polarization orientation, wherein the first and third conductive members are coupled to first and third external contacts, respectively, located on a first surface of the modular, multi-layer, dual-balun board structure and the second and fourth conductive members are coupled to second and fourth external contacts, respectively, located on a second, opposite surface of the modular, multi-layer, dual-balun board structure.

2. The array antenna of claim 1, wherein:
   a subset of the plurality of dual polarized radiating elements each have a corresponding modular, multi-layer, dual-balun board structure coupled thereto.

3. The array antenna of claim 1, wherein:
   the plurality of dual polarized radiating elements define a plurality of unit cells on the first dielectric layer, wherein the modular, multi-layer, dual-balun board structure fits within an extension of the unit cell associated with the first dual polarized radiating element.

4. The array antenna of claim 1, wherein:
the modular, multi-layer, dual-balun board structure includes the first and second external contacts to carry a balanced signal associated with the first polarization orientation of the first dual polarized radiating element and the third and fourth external contacts to carry a balanced signal associated with the second polarization orientation of the first dual polarized radiating element.

5. The array antenna of claim 4, wherein:
the modular, multi-layer, dual-balun board structure includes a crossover network coupled between the first, second, third, and fourth external contacts and the balanced ports of the first and second baluns.

6. The array antenna of claim 1, wherein:
the opening in the first dielectric layer through which the dual-balun board structure passes cuts through a central portion of the first dual polarized radiating element.

7. The array antenna of claim 5, wherein:
the opening in the first dielectric layer through which the dual-balun board structure passes is diagonally oriented with respect to the first dual polarized radiating element.

8. The array antenna of claim 1, wherein:
the first dual polarized radiating element is a dual polarized dipole element.

9. The array antenna of claim 1, wherein:
the dual-balun board structure includes a ground plane separating the first balun and the second balun.

10. The array antenna of claim 1, wherein:
the dual-balun board structure includes a first coaxial connector coupled to a single-ended input port of the first balun and a second coaxial connector coupled to a single-ended input port of the second balun.

11. The array antenna of claim 1, wherein:
the plurality of dual polarized radiating elements includes a plurality of coincident-phase center, dual polarized radiating elements.

12. A method for use in fabricating an array antenna, the method comprising:
providing an aperture board having a plurality of dual polarized radiating elements disposed thereon, the aperture board having openings through central regions of at least some of the dual polarized radiating elements;
providing a modular, multi-layer, dual-balun board having a first balun to feed a first polarization orientation of a dual polarized radiating element and a second balun to feed a second, orthogonal polarization orientation of the dual polarized radiating element;
inserting the modular, multi-layer, dual-balun board through an opening in the aperture board associated with a first dual polarized radiating element; and
securing contacts on the modular, multi-layer, dual-balun board directly to corresponding conductive portions of the first dual polarized radiating element using a conductive coupling agent; and
wherein the first dual polarized radiating element includes first and second conductive members associated with the first polarization orientation and third and fourth conductive members associated with the second polarization orientation, and wherein securing contacts includes securing the first and third conductive members to first and third contacts located on a first surface of the dual-balun board structure and securing the second and fourth conductive members to second and fourth contacts located on a second, opposite surface of the dual-balun board structure.

13. The method of claim 12, wherein:
the conductive coupling agent includes at least one of solder and conductive epoxy.

14. The method of claim 12, wherein:
the first and third conductive members are located on one side of the opening associated with the first dual polarized radiating element and the second and fourth conductive members are located on an opposite side of the opening.

15. The method of claim 14, wherein:
the contacts on the modular, multi-layer, dual-balun board structure include the first and second contacts conductively coupled to a balanced port of the first balun and the third and fourth contacts coupled to a balanced port of the second balun.

16. The method of claim 12, further comprising:
providing other modular, multi-layer, dual-balun boards having the same characteristics as the first board;
inserting the other dual-balun boards through openings in the aperture board associated with other dual polarized radiating elements; and
securing contacts on the other dual-balun boards directly to corresponding conductive portions of the other dual polarized radiating elements using a conductive coupling agent.

17. A multi-layer printed circuit board (PCB) comprising:
a first balun having a single ended port and a balanced port, the first balun being implemented on one or more first layers of the PCB;
a second balun having a single ended port and a balanced port, the second balun being implemented on one or more second layers of the PCB;
first, second, third, and fourth external contacts, the first and third contacts located on a first exterior surface of the PCB and the second and fourth contacts located on a second exterior surface of the PCB opposite the first surface; and
a crossover network to conductively couple the first and second exterior contacts to the balanced port of the first balun in a phase matched manner and to conductively couple the third and fourth exterior contacts to the balanced port of the second balun in a phase matched manner; and
wherein a balun end of the crossover network includes first and second terminals on a first layer and third and fourth terminals on a second layer, and an antenna end of the crossover network includes the first and third terminals on the first layer and the second and fourth terminals on the second layer, wherein the first and third terminals are coupled to the first and third contacts respectively and the second and fourth terminals are coupled to the second and fourth contacts respectively.

18. The multi-layer PCB of claim 17, further comprising:
a ground plane on an intermediate layer of the PCB, the ground plane separating the first balun from the second balun.

19. The multi-layer PCB of claim 18, wherein:
the ground plane forms a part of microstrip or stripline elements of both the first balun and the second balun.

* * * * *